(12) United States Patent
Fan et al.

(10) Patent No.: US 11,276,808 B2
(45) Date of Patent: Mar. 15, 2022

(54) CONDUCTIVE SUBSTRATE FOR A DISPLAY DEVICE

(71) Applicant: Wen-Chang Fan, Hsinchu (TW)

(72) Inventors: Wen-Chang Fan, Hsinchu County (TW); Chia-Pin Wang, Hsinchu County (TW)

(73) Assignee: Wen-Chang Fan, Hsinchu (TW)

( * ) Notice: Subject to any disclaimer, the term of this patent is extended or adjusted under 35 U.S.C. 154(b) by 112 days.

(21) Appl. No.: 16/713,879

(22) Filed: Dec. 13, 2019

(65) Prior Publication Data

US 2020/0227605 A1 Jul. 16, 2020

Related U.S. Application Data

(60) Provisional application No. 62/792,575, filed on Jan. 15, 2019.

(30) Foreign Application Priority Data

Sep. 13, 2019 (TW) .................................. 108133141

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0753* (2013.01); *H01L 27/156* (2013.01);
(Continued)

(58) Field of Classification Search
CPC ........ H05B 33/06; H05B 33/08; H05B 33/62; H05B 45/00; H05B 45/50–54;
(Continued)

(56) References Cited

U.S. PATENT DOCUMENTS

2019/0206927 A1* 7/2019 Lee ....................... H01L 27/153

* cited by examiner

*Primary Examiner* — Joseph L Williams
*Assistant Examiner* — Jose M Diaz
(74) *Attorney, Agent, or Firm* — Muncy, Geissler, Olds & Lowe, PC (57) ABSTRACT

A conductive substrate for a display device has a plurality of rows of electrode connecting areas, a plurality of first conductive wires, a plurality of second conductive wires, and a plurality of first transparent electrically insulating layers disposed on an electrically insulating substrate. The second conductive wires are separated by the rows of the electrode connecting areas each including a plurality of electrically isolated electrode connecting areas. Each of the second conductive wires disposed between two neighboring rows of the electrode connecting areas has its one end connected to a single electrode contact in one electrode connecting area of the same row of the electrode connecting areas. Each of the first transparent electrically insulating layers is disposed between the second conductive wires respectively connected to a first section and a second section of the electrode connecting areas in the same row of the electrode connecting areas. The second conductive wires connected to the first section of the electrode connecting areas in the same row of the electrode connecting areas are partly superimposed along the displaying direction of the display device by the second conductive wires connected to the second section of the electrode connecting areas in the same row of the electrode connecting areas.

10 Claims, 3 Drawing Sheets

(51) Int. Cl.
*H01L 27/32* (2006.01)
*H01L 27/15* (2006.01)

(52) U.S. Cl.
CPC ........ *H01L 27/326* (2013.01); *H01L 27/3258* (2013.01); *H01L 27/3276* (2013.01)

(58) Field of Classification Search
CPC . H01L 51/504; H01L 51/5064; H01L 51/508; H01L 51/5203; H01L 27/3258; H01L 27/3276; H01L 27/326; H01L 27/156; H01L 25/0753; H01L 25/075–0756
See application file for complete search history.

CONDUCTIVE SUBSTRATE FOR A DISPLAY DEVICE

CROSS-REFERENCE TO RELATED APPLICATIONS

The present application claims the benefit of U.S. provisional application Ser. No. 62/792,575 filed on Jan. 15, 2019 and Taiwan application Ser. No. 108133141 filed on Sep. 13, 2019 which are incorporated herein by reference.

TECHNICAL FIELD

The present invention relates to a display device and more particularly to a conductive substrate for a display device.

BACKGROUND

Light emitting diode (LED) is an electronic component with illuminating material made of semiconductors. Compared with incandescent lamps and cold cathode fluorescent lamps, a LED has advantages of power saving, eco-friendliness, long life span, small volume and fast response. The mature development of using LEDs as spontaneous emitting light sources in the display technology field enables the replacement of the mainstreamed LCD display devices by the flattening, thinning, and lightening LED display devices. On the other hand, an LED device is also becoming a large-size device and aims to be a new favorite in the multimedia information display field.

To light up every LED chip in the LED chip array of an LED display device, there must be good conductivity between the substrate carrying the LED chip array and the LED chip array. On the other hand, there must be enough LED chips in the LED array to enable plentiful displaying of the LED display device to fulfill various demands. However, this incurred an increasement of the conductive circuits on the substrate carrying the LED chip array and thus lowers transparency as required by the LED display device. Therefore, the proposed invention is to solve the technic problem of maintaining high transparency of the substrate while fulfilling various display demands for a LED display device.

SUMMARY

In view of the above-mentioned issues, the present application proposed a conductive substrate for a display device.

In one embodiment, the proposed conductive substrate for a display device includes an electrically insulating substrate, a plurality of rows of electrode connecting areas, a plurality of first conductive wires, a plurality of second conductive wires, and a plurality of first transparent electrically insulating layers. The rows of electrode connecting areas are separately disposed from each other on the electrically insulating substrate with each of the rows of the electrode connecting areas having the electrode connecting areas being electrically isolated and spaced from each other in a line. The electrode connecting areas each have a plurality of electrode contacts being electrically isolated from each other. The electrode contacts include a first electrode contact and a plurality of second electrode contacts respectively served to electrically connect a common electrode and a plurality of single electrodes of a light emitting source. Each of the rows of the electrode connecting areas is divided into a plurality of sections including at least a first section and a second section. The first conductive wires are spaced from each other while disposed on the electrically insulating substrate and each of the first conductive wires extends along a neighboring row of the electrode connecting areas and connects with the first electrode contact inside each of the electrode connecting areas of the neighboring row of the electrode connecting areas. The second conductive wires are spaced from each other while disposed on the electrically insulating substrate with one end of each of the second conductive wires between two adjacent rows of the electrode connecting areas being electrically connected with one of the second electrode contacts inside one of the electrode connecting areas of the neighboring row of the electrode connecting areas. The first transparent electrically insulating layers are spaced from each other while disposed on the electrically insulating substrate with each of the first transparent electrically insulating layer being disposed between the second conductive wires respectively connected to the electrode connecting areas within the first section and the electrode connecting areas within the second section of the same row of the electrode connecting areas. The second conductive wires respectively connected to the electrode connecting areas within the first section and the electrode connecting areas within the second section of the same row of the electrode connecting areas are partly superimposed with each other along a displaying direction of the display device.

In one embodiment, the proposed conductive substrate for the display device further includes a plurality of outward electrical connecting areas disposed on the electrically insulating substrate and next to one side of the electrically insulating substrate and respectively correspond with the rows of the electrode connecting areas. The outward electrical connecting areas each have a plurality of columns of electrical connecting pads which are spaced from each other. The other ends of the second conductive wires are respectively electrically connected to the electrical connecting pads.

In one embodiment, in the proposed conductive substrate for the display device, the number of the columns of the electrical connecting pads in each of the outward electrical connecting areas equals the number of the sections within the corresponding row of the electrode connecting areas.

In one embodiment, in the proposed conductive substrate for the display device, a distance between any one of the electrode connecting areas within the first section of a row of the electrode connecting areas and the outward electrical connecting area corresponding to the same row of the electrode connecting areas is larger than a distance between any one of the electrode connecting areas within the second section of the same row of the electrode connecting areas and the outward electrical connecting area corresponding to the same row of the electrode connecting areas, and an impedance per unit distance of the second conductive wires electrically connected with the electrode connecting areas within the first section is smaller than the impedance per unit distance of the second conductive wires electrically connected with the electrode connecting areas within the second section of the same row of the electrode connecting areas.

In one embodiment, in the proposed conductive substrate for the display device, any of the second conductive wires electrically connected with the electrode connecting areas within the first section of the same row of the electrode connecting areas has a copper layer as a cover.

In one embodiment, the conductive substrate for the display device further includes a plurality of second transparent electrically insulating layers which are spaced from each other while disposed on the electrically insulating substrate. The sections of each of the rows of the electrode connecting areas further include a third section, each of the second transparent electrically insulating layer is disposed between the second conductive wires respectively connected to the electrode connecting areas within the third section and the electrode connecting areas within the second section of the same row of the electrode connecting areas, and the second conductive wires respectively connected to the electrode connecting areas within the third section and the electrode connecting areas within the second section of the same row of the electrode connecting areas are partly superimposed with each other along the displaying direction of the display device.

In one embodiment, in the proposed conductive substrate for the display device, a distance between any of the electrode connecting areas within the first section of a row of the electrode connecting areas and the outward electrical connecting area corresponding to the same row of the electrode connecting areas is larger than a distance between any of the electrode connecting areas within the second section of the same row of electrode connecting areas and the outward electrical connecting area corresponding to the same row of the electrode connecting areas. A distance between any of the electrode connecting areas within the second section of the same row of the electrode connecting areas and the outward electrical connecting area corresponding to the same row of the electrode connecting areas is larger than a distance between any of the electrode connecting areas within the third section of the same row of the electrode connecting areas and the outward electrical connecting area corresponding to the same row of the electrode connecting areas. An impedance per unit distance of the second conductive wires electrically connected with the electrode connecting areas within the second section is larger than the impedance per unit distance of the second conductive wires electrically connected with the electrode connecting areas within the first section of the same row of the electrode connecting areas and smaller than the impedance per unit distance of the second conductive wires electrically connected with the electrode connecting areas within the third section of the same row of the electrode connecting areas.

In one embodiment, in the proposed conductive substrate for the display device, any of the second conductive wires electrically connected with the electrode connecting areas within the second section has a first part formed with an electrically insulating layer and a second part formed with a copper layer, and the electrically insulating layer and the copper layer are formed on the same plane.

In one embodiment, the first conductive wires and the second conductive wires of the proposed conductive substrate for the display device are made essentially of metal, and the second conductive wires electrically connected with the electrode connecting areas within the first section and the first conductive wires electrically connected with the same row of the electrode connecting areas are disposed on the same plane.

In one embodiment, the conductive substrate for the display device further includes a layer of transparent conductive patterns which is disposed on and contacts with a surface of the electrically insulating substrate, and the electrode contacts are disposed on the transparent conductive patterns to respectively contact with the surface of the layer of transparent conductive patterns.

In the above-mentioned embodiments, the electrode connecting areas, the first conductive wires, and the second conductive wires have high electrical conductivity when compared with a conventional conductive substrate for a LED display device. On the one hand, the first conductive wires are used to be electrically connected with the first electrode contacts in all the electrode connecting areas of the same row which is next to the first conductive wires and therefore simplifies the conductive wiring layout for the common electrodes of all the light emitting sources. On the other hand, the second conductive wires connecting with the second electrode contacts in all the electrode connecting areas of the same row are disposed in different layers in distinct sections to accomplish overlapping wiring layout and thus solve the lowered transparency problem caused by an increasement of the conductive circuits connecting every single electrodes of the light sources in a large-size display device. In sum, the proposed conductive substrate for a display device lowers the ratio of the areas of the conductive wires connecting between the electrode contacts in the rows of the electrode connecting areas and the periphery of the conductive substrate to the areas of the entire conductive substrate to increase the transparency of the conductive substrate for the display device and simplifies the complexity in manufacturing the display device through a patterning process.

Other various objects, advantages and features of the present invention will become readily apparent from the ensuing detailed description accompanying drawings, and the novel features will be particularly pointed out in the appended claims.

BRIEF DESCRIPTION OF DRAWINGS

The following detailed descriptions, given by way of example, and not intended to limit the present invention solely thereto, will be best be understood in conjunction with the accompanying figures.

DETAILED DESCRIPTION OF THE EMBODIMENTS

The invention discloses a conductive substrate for a display device. The figures referred in the following description may not be plotted in real scale but only intended to show the features and technical meanings of this invention and do not limit the scope of the invention. Additionally, the technical terms in the following should be interpreted according to its ordinary meaning or the meaning as described.

Figure 1:
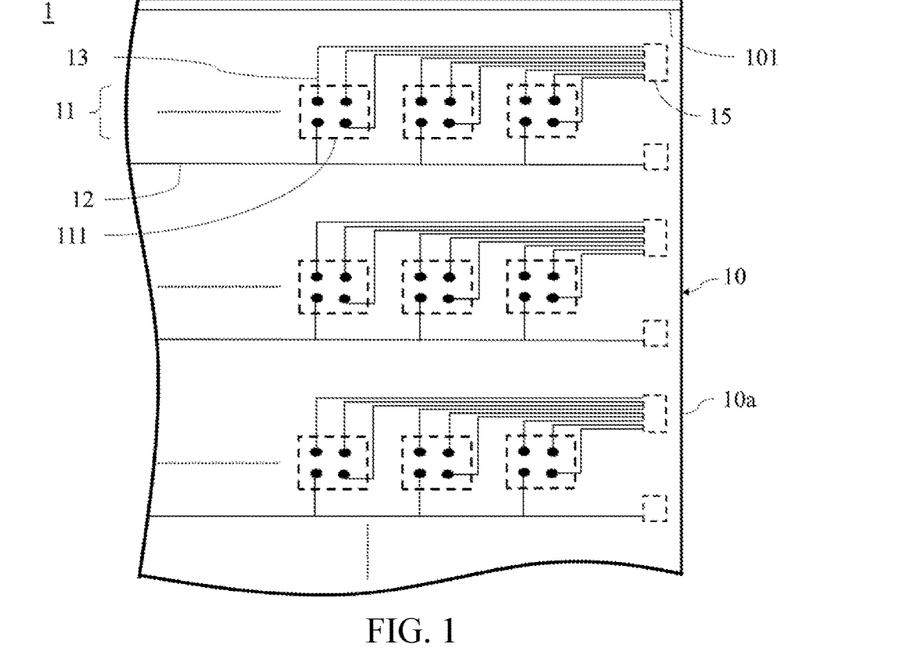
FIG. 1 is a plane view schematically showing a plurality rows of electrode connecting areas of a conductive substrate for a display device according to one embodiment of the invention.
Figure 2:
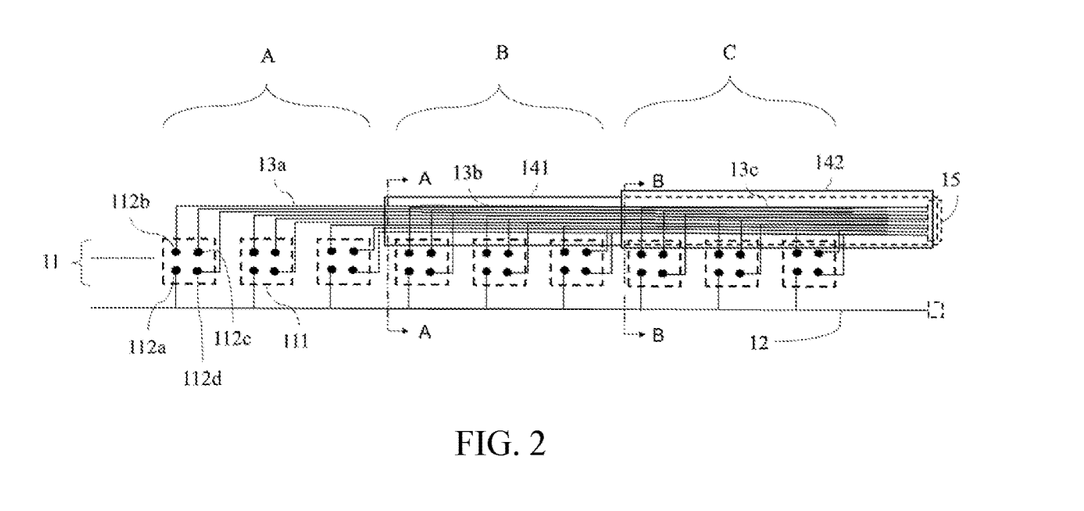
FIG. 2 is a plane view schematically showing a first conductive wires and a second conductive wires in each of the rows of the electrode connecting areas of the conductive substrate for the display device according to one embodiment of the invention.

FIG. 1 is a plane view schematically showing a plurality rows of electrode connecting areas of a conductive substrate for a display device according to one embodiment of the invention. FIG. 2 is a plane view schematically showing a first conductive wires and a second conductive wires in each of the rows of the electrode connecting areas of the conductive substrate for the display device according to one embodiment of the invention. Referring to FIG. 1 and FIG. 2, in one embodiment, the conductive substrate 1 for the display device includes an electrically insulating substrate 10, a plurality of rows 11 of electrode connecting areas, a plurality of first conductive wires 12, a plurality of second conductive wires 13, and a plurality of first transparent electrically insulating layers 141. In this embodiment, the rows 11 of the electrode connecting areas are separately disposed from each other on the electrically insulating substrate 10. Each of the rows 11 of the electrode connecting areas has a plurality of electrode connecting areas 111 which are electrically isolated and spaced from each other in a line. The electrode connecting areas 111 each have a plurality of electrode contacts 112a, 112b, 112c, and 112d that are electrically isolated from each other. The electrode contact 112a is served to electrically connect a common electrode of a light emitting source while the electrode contacts 112b, 112c, and 112d are respectively served to electrically connect a plurality of single electrodes of the same light emitting source. Hereinafter, the electrode contact 112a is briefly called as a first electrode contact while the electrode contacts 112b, 112c, and 112d are briefly called as second electrode contacts. In another embodiment, a patterned transparent conductive layer 101 may be formed on the electrically insulating substrate 10 to touch the surface of the electrically insulating substrate 10, and the electrode contacts 112a, 112b, 112c, and 112d are disposed on the patterned transparent conductive layer 101 to touch the surface of the patterned transparent conductive layer 101. The patterned transparent conductive layer 101 can be used to improve the heat dissipation of these electrode contacts. The patterned transparent conductive layer 101 may be a film layer of Indium Tin Oxide (ITO), Fluorine doped Tin Oxide (FTO), Zinc Oxide (ZnO) film, or Aluminum-doped Zinc Oxide (AZO) formed via sputter deposition or evaporation. The electrically insulating substrate 10 may be a transparent substrate to form a transparent display device. The electrically insulating substrate 10 may be made of glass, ceramic, aluminum nitride ceramic, polycarbonate, polyethylene terephthalate, polyimide or cyclic olefin copolymer. The light emitting source may be a LED capable of emitting red, blue, and green light and the common electrode of the light emitting diode may be an input voltage electrode of the LED while the single electrodes of the light emitting source may be grounded electrodes for the red, blue, and green lights.

Referring again to FIG. 1 and FIG. 2, the first conductive wires 12 are spaced from each other while disposed on the electrically insulating substrate 10 and each of the first conductive wires 12 extends along a neighboring row 11 of the electrode connecting areas and connects with the first electrode contact 112a inside each of the electrode connecting areas 111 of the neighboring row 11 of the electrode connecting areas. The second conductive wires 13 are spaced from each other while disposed on the electrically insulating substrate 10 and respectively extend along the rows 11 of the electrode connecting areas.

One end of each of the second conductive wires 13 disposed between two adjacent rows 11 of the electrode connecting areas is electrically connected with one of the second electrode contacts 112b, 112c, 112d inside one of the electrode connecting areas 111 of the neighboring row 11 of the electrode connecting areas 111. The first conductive wires 12 and the second conductive wires 13 may be formed on same or distinct conductive layer via a patterning process accomplished with a screen printing or a spray printing. The first conductive wires 12 and the second conductive wires 13 are made essentially of metal.

Figure 3:
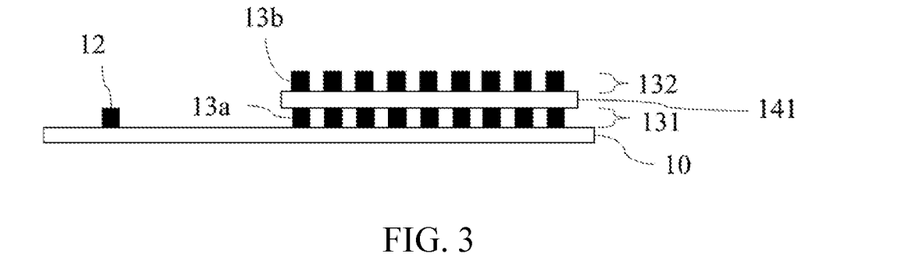
FIG. 3 is a cross-sectional view showing the A-A section in FIG. 2.
Figure 4:
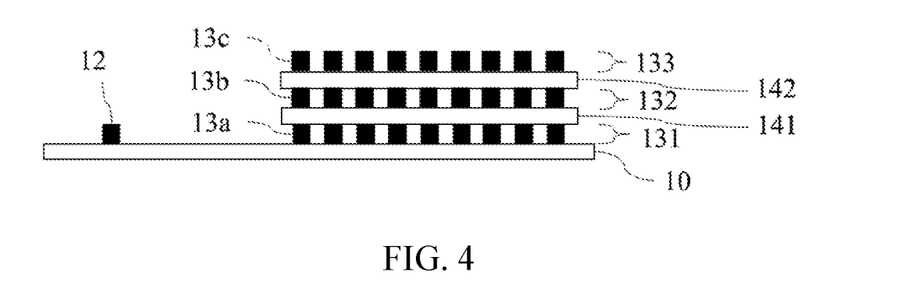
FIG. 4 is a cross-sectional view showing the B-B section in FIG. 2.
Figure 6:
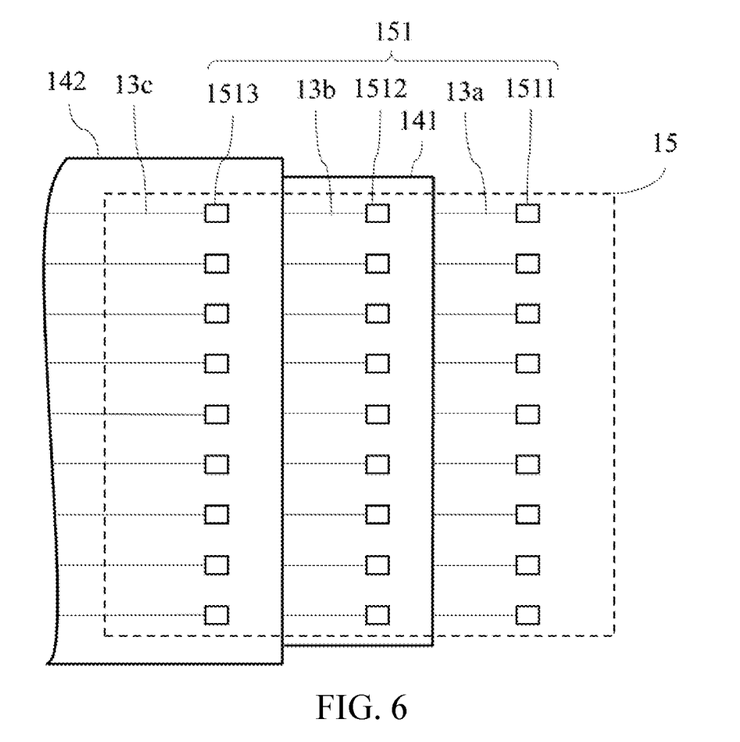
FIG. 6 is a plane view schematically showing a plurality of outward electrical connecting areas on the conductive substrate for the display device according to one embodiment of the invention.

FIG. 3 is a cross-sectional view showing the A-A section in FIG. 2. FIG. 4 is a cross-sectional view showing the B-B section in FIG. 2. Referring to FIGS. 2, 3, and 4, in one embodiment, each of the rows 11 of the electrode connecting areas 111 is divided into a plurality of sections including at least a first section A and a second section B, wherein the first section A and the second section B are distinct sections in the same row. In other words, each of the rows 11 of the electrode connecting areas includes at least the electrode connecting areas 111 within the first section A and the electrode connecting areas 111 within the second section B. The second conductive wires 13 include at least the second conductive wires 13a connecting with the electrode connecting areas 111 within the first section A and the second conductive wires 13b connecting with the electrode connecting areas 111 within the second section B of the same row of the electrode connecting areas. Moreover, the other ends of all the second conductive wires 13a and 13b respectively connecting with the second electrode contacts 112b, 112c, and 112d in the electrode connecting areas 111 within the first section A and the second section B of the same row are respectively electrically connected to a plurality of columns of electrical connecting pads 151 (as shown in FIG. 6) in a plurality of outward electrical connecting areas 15 which are disposed on the electrically insulating substrate 10 and next to one side 10a of the electrically insulating substrate 10 and respectively correspond with the rows 11 of the electrode connecting areas. The number of the columns of the electrical connecting pads 151 in each of the outward electrical connecting areas 15 equals the number of the sections within the corresponding row 11 of the electrode connecting areas.

Referring again to FIGS. 2, 3, and 4, in one embodiment, the first transparent electrically insulating layers 141 are spaced from each other while disposed on the electrically insulating substrate 10 with each of the first transparent electrically insulating layers 141 being disposed between the second conductive wires 13a connected to the electrode connecting areas 111 within the first section A and the second conductive wires 13b connected to the electrode connecting areas 111 within the second section B of the same row 11. The second conductive wires 13b and 13a respectively connected to the electrode connecting areas 111 within the first section A and the electrode connecting areas 111 within the second section B of the same row of the electrode connecting areas 111 are partly superimposed with each other along a displaying direction (shown as the normal direction of the paper) of the display device. Specifically, the second conductive wires 13a connecting with the electrode connecting areas 111 within the first section A of the same row 11 of the electrode connecting areas are formed in a first conductive layer 131, while the second conductive wires 13b connecting with the electrode connecting areas 111 within the second section B of the same row 11 of the electrode connecting areas are formed in a second conductive layer 132, wherein the first conductive layer 131 and the second conductive layer 132 are not in the same plane.

Referring again to FIGS. 2, 3, and 4, in another embodiment, the sections of each of the rows 11 of the electrode connecting areas further include a third section C. The third section C, the first section A, and the second section B are different sections of the same row. In other words, each of the rows 11 of the electrode connecting areas includes at least electrode connecting areas 111 respectively disposed within the first section A, the second section B, and the third section C. The second conductive wires 13 therefore include at least the second conductive wires 13a connecting with the electrode connecting areas 111 within the first section A, the second conductive wires 13b connecting with the electrode connecting areas 111 within the second section B, and the second conductive wires 13c connecting with the electrode connecting areas 111 within the third section C. Besides, the other ends of all the second conductive wires 13a, 13b, and 13c respectively connecting with the second electrode contacts 112b, 112c, and 112d in the electrode connecting areas 111 within the first section A, the second section B, and the third section C of the same row 11 are respectively electrically connected to a plurality of columns of electrical connecting pads 151 (as shown in FIG. 6) in a plurality of outward electrical connecting areas 15 which are respectively disposed on the electrically insulating substrate 10 and next to one side 10a of the electrically insulating substrate 10 and correspond with the same row 11 of the electrode connecting areas.

The number of the columns of the electrical connecting pads 151 in each of the outward electrical connecting areas 15 equals the number of the sections within the corresponding row 11 of the electrode connecting areas.

Referring to FIGS. 2, 3, and 4, in another embodiment, the conductive substrate 1 for a display device further includes a plurality of second transparent electrically insulating layers 142 which are spaced from each other while disposed on the electrically insulating substrate 10. Each of the second transparent electrically insulating layer 142 is disposed between the second conductive wires 13c connecting with the electrode connecting areas 111 within the third section C and the second conductive wires 13b connecting with the electrode connecting areas 111 within the second section B of the same row 11 of the electrode connecting areas. The second conductive wires 13c and 13b respectively connected to the electrode connecting areas 111 within the third section C and the second section B of the same row of the electrode connecting areas 111 are partly superimposed with each other along a displaying direction (shown as the normal direction of the paper) of the display device. Specifically, the second conductive wires 13a connecting with the electrode connecting areas 111 within the first section A of the same row 11 of the electrode connecting areas are formed in a first conductive layer 131, the second conductive wires 13b connecting with the electrode connecting areas 111 within the second section B of the same row 11 of the electrode connecting areas are formed in a second conductive layer 132, and the second conductive wires 13c connecting with the electrode connecting areas 111 within the third section C of the same row 11 of the electrode connecting areas are formed in a third conductive layer 133, wherein the first conductive layer 131, the second conductive layer 132 and the third conductive layer 133 are formed in different planes. In addition, the second transparent electrically insulating layer 142 is wider than the first transparent electrically insulating layers 141 in the direction perpendicular to the path of the second conductive wires 13c and the second conductive wires 13b to enable the second conductive wires 13c coming from the electrode connecting areas 111 to reach the surface of the second transparent electrically insulating layer 142 by crossing only one step, which is between the surface of the electrode connecting areas 111 and the surface of the second transparent electrically insulating layer 142. In this way, the second conductive wires 13c would not be breakable due to only the mentioned step.

Referring to FIG. 3, in one embodiment, the second conductive wires 13a electrically connected with the electrode connecting areas 111 within the first section A and the first conductive wires 12 electrically connected with the same row 11 of the electrode connecting areas 111 may be disposed on the same plane.

Referring to FIG. 2, in one embodiment, a distance between any one of the electrode connecting areas 111 within the first section A of a row 11 of the electrode connecting areas and the outward electrical connecting area 15 corresponding to the same row 11 of the electrode connecting areas is larger than a distance between any one of the electrode connecting areas 111 within the second section B of the same row 11 of the electrode connecting areas 111 and the outward electrical connecting area 15 corresponding to the same row 11 of the electrode connecting areas, and an impedance per unit distance of the second conductive wires 13a electrically connected with the electrode connecting areas 111 within the first section A is smaller than the impedance per unit distance of the second conductive wires 13b electrically connected with the electrode connecting areas 111 within the second section B. In another embodiment, a distance between any one of the electrode connecting areas 111 within the second section B of the same row 11 of the electrode connecting areas and the outward electrical connecting area 15 corresponding to the same row 11 of the electrode connecting areas is larger than a distance between any one of the electrode connecting areas 11 within the third section C of the same row 11 of the electrode connecting areas and the outward electrical connecting area 15 corresponding to the same row 11 of the electrode connecting areas, and an impedance per unit distance of the second conductive wires 13b electrically connected with the electrode connecting areas 111 within the second section B is larger than the impedance per unit distance of the second conductive wires 13a electrically connected with the electrode connecting areas 111 within the first section A of the same row of the electrode connecting areas and smaller than the impedance per unit distance of the second conductive wires 13c electrically connected with the electrode connecting areas 111 within the third section C of the same row of the electrode connecting areas to enable an entirely uniform brightness of the display device.

Referring to FIG. 2, in one embodiment, an outer surface of at least one of the second conductive wires 13a connecting with the electrode connecting areas 111 within the first section A of the same row 11 of the electrode connecting areas 111 is covered with a highly conductive metal layer which is different from the inner material of the second conductive wires 13a, such as a copper layer, to increase electricity conductivity. On the other hand, only a part of the outer surface of each of the second conductive wires 13b connecting with the electrode connecting areas 111 within the second section B of the same row 11 of the electrode connecting areas 111 is covered with the highly conductive metal layer which is different from the inner material of the second conductive wires 13b, such as a copper layer, while other parts of the outer surface of each of the second conductive wires 13b connecting with the electrode connecting areas 111 within the second section B of the same row 11 of the electrode connecting areas 111 were not covered with the highly conductive metal layer which is different from the inner material of the second conductive wires 13*b*. An outer surface of each of the second conductive wires 13*c* connecting with the electrode connecting areas 111 within the third section C of the same row 11 of the electrode connecting areas 111 is totally not covered with a highly conductive metal layer which is different from the inner material of the second conductive wires 13*c*. In this manner, it is achieved that an impedance per unit distance of the second conductive wires 13*b* electrically connected with the electrode connecting areas 111 within the second section B is larger than the impedance per unit distance of the second conductive wires 13*a* electrically connected with the electrode connecting areas 111 within the first section A of the same row of the electrode connecting areas and smaller than the impedance per unit distance of the second conductive wires 13*c* electrically connected with the electrode connecting areas 111 within the third section C of the same row of the electrode connecting areas.

Figure 5:
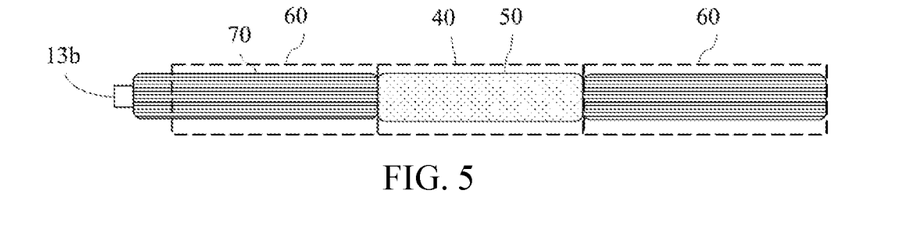
FIG. 5 is a plane view schematically showing an electrically insulating part and a metal part of each of the second conductive wires on the conductive substrate for the display device according to one embodiment of the invention.

FIG. 5 is a plane view schematically showing an electrically insulating part and a metal part of each of the second conductive wires on the conductive substrate for the display device according to one embodiment of the invention. As shown in FIG. 5, the way to accomplish that only a part of the outer surface of each of the second conductive wires 13*b* connecting with the electrode connecting areas 111 within the second section B of the same row 11 of the electrode connecting areas 111 is covered with the highly conductive metal layer while other parts of the outer surface of each of the second conductive wires 13*b* connecting with the electrode connecting areas 111 within the second section B of the same row 11 of the electrode connecting areas 111 were not covered with the highly conductive metal layer, an electrically insulating material may firstly be applied onto a first part 40 of an outer surface of the second conductive wires 13*b* to form an electrically insulating layer 50 and a metal material such as a copper material may then be applied onto a second part 60 of the outer surface of the second conductive wires 13*b* to form a metal layer 70 such as a copper layer. The electrically insulating layer 50 and the metal layer 70 may be formed on the same plane. In this way, the impedance of the second conductive wires 13*b* can be adjusted as required. The application of the electrically insulating material may be accomplished via screen printing and the application of the metal material may be accomplished via electroless plating or plating.

FIG. 6 is a plane view schematically showing a plurality of outward electrical connecting areas on the conductive substrate for the display device according to one embodiment of the invention. Referring to FIGS. 1, 2, and 6, in one embodiment, the other ends of all the second conductive wires 13 including the conductive wires 13*a*, 13*b*, and 13*c* respectively connecting with the second electrode contacts 112*b*, 112*c*, and 112*d* in the electrode connecting areas 111 within the first section A, the second section B, and the third section C of the same row are respectively electrically connected to a plurality of columns of electrical connecting pads 151 in a plurality of outward electrical connecting areas 15 which are disposed on the electrically insulating substrate 10 and next to one side 10*a* of the electrically insulating substrate 10 and respectively correspond with the same row 11 of the electrode connecting areas. The number of the columns of the electrical connecting pads 151 in each of the outward electrical connecting areas 15 equals the number of the sections within the corresponding row 11 of the electrode connecting areas. As shown in FIGS. 2 and 6, the electrical connecting pads 151 are arranged in three columns and include the electrical connecting pads 1511 in the right column, the electrical connecting pads 1512 in the middle column, and the electrical connecting pads 1513 in the left column, while the corresponding row 11 of the electrical connecting areas 111 is divided into three sections including the first section A, the second section B, and the third section C. The number of the mentioned columns and the sections however are not limited in the invention. The electrical connecting pads 1511, 1512, and 1513 in the same column are aligned with one other.

Specifically, the other ends of all the second conductive wires 13*a* connecting with the second electrode contacts 112*b*, 112*c*, and 112*d* in the electrode connecting areas 111 within the first section A of the same row are respectively electrically connected to the electrical connecting pads 1511 aligned in the right column in the outward electrical connecting areas 15 corresponding to the same row 11 of the electrode connecting areas, and the number of the electrical connecting pads 151 in the right column equals the number of the second conductive wires 13*a*; the other ends of all the second conductive wires 13*b* connecting with the second electrode contacts 112*b*, 112*c*, and 112*d* in the electrode connecting areas 111 within the second section A of the same row are respectively electrically connected to the electrical connecting pads 1512 aligned in the middle column in the outward electrical connecting areas 15 corresponding to the same row 11 of the electrode connecting areas, and the number of the electrical connecting pads 1512 in the middle column equals the number of the second conductive wires 13*b*; and the other ends of all the second conductive wires 13*c* connecting with the second electrode contacts 112*b*, 112*c*, and 112*d* in the electrode connecting areas 111 within the third section C of the same row are respectively electrically connected to the electrical connecting pads 1513 aligned in the left column in the outward electrical connecting areas 15 corresponding to the same row 11 of the electrode connecting areas, and the number of the electrical connecting pads 1513 in the left column equals the number of the second conductive wires 13*c*. As shown in FIG. 6, the number of the electrical connecting pads 1511, 1512, and 1513 in the same column may be but not limited to 9.

Referring to FIGS. 4 and 6, in one embodiment, the electrically connecting pads 1511 are exposed without being covered by the first transparent electrically insulating layer 141 and the second conductive wires 13*a* are electrically insulated from the second conductive wires 13*b* and the electrical connecting pads 1512 by the first transparent electrically insulating layer 141. The electrically connecting pads 1512 are exposed without being covered by the second transparent electrically insulating layer 142 and the second conductive wires 13*b* are electrically insulated from the second conductive wires 13*c* and the electrical connecting pads 1513. This arrangement enables the layout area and location of the second conductive wires 13*a*, 13*b*, and 13*c* to overlap with one another without being electrically short-circuited. As a result, the transparency of the conductive substrate for the display device is increased.

In the above-mentioned embodiments, the electrode connecting areas, the first conductive wires, and the second conductive wires have high electrical conductivity when compared with a conventional conductive substrate for a LED display device. On the one hand, the first conductive wires are used to be electrically connected with the first electrode contacts in all the electrode connecting areas of the same row which is next to the first conductive wires and therefore simplifies the conductive wiring layout for the common electrodes of all the light emitting sources. On the other hand, the second conductive wires connecting with the second electrode contacts in all the electrode connecting areas of the same row are disposed in different layers in distinct sections to accomplish overlapping wiring layout and thus solve the lowered transparency problem caused by an increasement of the conductive circuits connecting every single electrodes of the light sources in a large-size display device. In sum, the proposed conductive substrate for a display device lowers the ratio of the areas of the conductive wires connecting between the electrode contacts in the rows of the electrode connecting areas and the periphery of the conductive substrate to the areas of the entire conductive substrate to increase the transparency of the conductive substrate for the display device and simplifies the complexity in manufacturing the display device through a patterning process.

Having described at least one of the embodiments of the claimed invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure and its modifications and variations are within the scope of the appended claims and their equivalents. Specifically, one or more limitations recited throughout the specification can be combined in any level of details to the extent as described to accomplish the touch display devices.

What is claimed is:

1. A conductive substrate for a display device, comprising:
    an electrically insulating substrate;
    a plurality of rows of electrode connecting areas being separately disposed from each other on the electrically insulating substrate, each row of the electrode connecting areas having the electrode connecting areas being electrically isolated and spaced from each other in a line, the electrode connecting areas each having a plurality of electrode contacts being electrically isolated from each other, the electrode contacts of the electrode connecting area including a first electrode contact and a plurality of second electrode contacts, the first electrode contact being served to electrically connect a common electrode of a light emitting source, the second electrode contacts being served to electrically connect a plurality of single electrodes of the light emitting source, respectively, each row of the electrode connecting areas being divided into a plurality of sections including at least a first section and a second section;
    a plurality of first conductive wires being spaced from each other while disposed on the electrically insulating substrate, the first conductive wires each extending along a neighboring row of the electrode connecting areas and connecting with the first electrode contact inside each of the electrode connecting areas of the neighboring row of the electrode connecting areas;
    a plurality of second conductive wires being spaced from each other while disposed on the electrically insulating substrate, one end of each of the second conductive wires disposed between two adjacent rows of the electrode connecting areas being electrically connected with one of the second electrode contacts inside one of the electrode connecting areas of the neighboring row of the electrode connecting areas; and
    a plurality of first transparent electrically insulating layers being spaced from each other while disposed on the electrically insulating substrate, each of the first transparent electrically insulating layer being disposed between the second conductive wires connected to the electrode connecting areas within the first section and the second conductive wires connected to the electrode connecting areas within the second section of the same row of the electrode connecting areas,
    wherein the second conductive wires connected to the electrode connecting areas within the first section and the second conductive wires connected to the electrode connecting areas within the second section of the same row of the electrode connecting areas are electrically insulated by one of the first transparent electrically insulating layers and are partly superimposed with each other along a displaying direction of the display device.

2. The conductive substrate for the display device of claim 1, further comprising:
    a plurality of outward electrical connecting areas disposed on the electrically insulating substrate and next to one side of the electrically insulating substrate, the outward electrical connecting areas each corresponding with one row of the electrode connecting areas, the outward electrical connecting areas each having a plurality of columns of electrical connecting pads being spaced from each other, wherein an other end of each of the second conductive wires is electrically connected to one of the electrical connecting pads.

3. The conductive substrate for the display device of claim 2, wherein number of the columns of the electrical connecting pads in each of the outward electrical connecting areas equals number of the sections within the corresponding row of the electrode connecting areas.

4. The conductive substrate for the display device of claim 2, wherein a distance between any of the electrode connecting areas within the first section of a row of the electrode connecting areas and the outward electrical connecting area corresponding to the same row of the electrode connecting areas is larger than a distance between any of the electrode connecting areas within the second section of the same row of the electrode connecting areas and the outward electrical connecting area corresponding to the same row of the electrode connecting areas, and an impedance per unit distance of the second conductive wires electrically connected with the electrode connecting areas within the first section is smaller than the impedance per unit distance of the second conductive wires electrically connected with the electrode connecting areas within the second section of the same row of the electrode connecting areas.

5. The conductive substrate for the display device of claim 4, wherein any of the second conductive wires electrically connected with the electrode connecting areas within the first section of the same row of the electrode connecting areas has a copper layer as a cover.

6. The conductive substrate for the display device of claim 2, further comprising:
    a plurality of second transparent electrically insulating layers being spaced from each other while disposed on the electrically insulating substrate, wherein the sections of each row of the electrode connecting areas further include a third section, each of the second transparent electrically insulating layers is disposed between the second conductive wires connected to the electrode connecting areas within the third section and the second conductive wires connected to the electrode connecting areas within the second section of the same row of the electrode connecting areas, and the second conductive wires connected to the electrode connecting areas within the third section and the second conductive wires connected to the electrode connecting areas within the second section of the same row of the electrode connecting areas are electrically insulated by one of the second transparent electrically insulating layer and are partly superimposed with each other along the displaying direction of the display device.

7. The conductive substrate for the display device of claim 6, wherein a distance between any of the electrode connecting areas within the first section of a row of the electrode connecting areas and the outward electrical connecting area corresponding to the same row of the electrode connecting areas is larger than a distance between any of the electrode connecting areas within the second section of the same row of electrode connecting areas and the outward electrical connecting area corresponding to the same row of the electrode connecting areas, a distance between any of the electrode connecting areas within the second section of the same row of the electrode connecting areas and the outward electrical connecting area corresponding to the same row of the electrode connecting areas is larger than a distance between any of the electrode connecting areas within the third section of the same row of the electrode connecting areas and the outward electrical connecting area corresponding to the same row of the electrode connecting areas, and an impedance per unit distance of the second conductive wires electrically connected with the electrode connecting areas within the second section is larger than the impedance per unit distance of the second conductive wires electrically connected with the electrode connecting areas within the first section of the same row of the electrode connecting areas and smaller than the impedance per unit distance of the second conductive wires electrically connected with the electrode connecting areas within the third section of the same row of the electrode connecting areas.

8. The conductive substrate for the display device of claim 7, wherein any of the second conductive wires electrically connected with the electrode connecting areas within the second section has a first part formed with an electrically insulating layer and a second part formed with a copper layer, and the electrically insulating layer and the copper layer are formed on the same plane.

9. The conductive substrate for the display device of claim 1, wherein the first conductive wires and the second conductive wires are made essentially of metal, and the second conductive wires electrically connected with the electrode connecting areas within the first section and the first conductive wires electrically connected with the same row of the electrode connecting areas are disposed on the same plane.

10. The conductive substrate for the display device of claim 1, further comprising:
a layer of transparent conductive patterns being disposed on and contacting with a surface of the electrically insulating substrate, wherein the electrode contacts are disposed on the transparent conductive patterns to respectively contact with a surface of the layer of the transparent conductive patterns.

* * * * *